United States Patent
Mizoguchi

(10) Patent No.: US 8,564,325 B2
(45) Date of Patent: Oct. 22, 2013

(54) VOLTAGE DETECTION DEVICE AND SYSTEM

(75) Inventor: Tomomichi Mizoguchi, Nagoya (JP)

(73) Assignee: Denso Corporation, Kariya (JP)

( * ) Notice: Subject to any disclaimer, the term of this patent is extended or adjusted under 35 U.S.C. 154(b) by 203 days.

(21) Appl. No.: 13/293,420

(22) Filed: Nov. 10, 2011

(65) Prior Publication Data

US 2012/0112785 A1    May 10, 2012

(30) Foreign Application Priority Data

Nov. 10, 2010  (JP) ................................ 2010-251940

(51) Int. Cl.
*G01R 31/26* (2006.01)
*G01N 27/416* (2006.01)

(52) U.S. Cl.
USPC ...................... 324/762.08; 324/434

(58) Field of Classification Search
USPC ............... 324/762.01–762.1, 764.01, 765.01, 324/750.01–750.3, 761.01, 434, 431; 257/48; 320/104, 105, 107, 132, 130
See application file for complete search history.

(56) References Cited

U.S. PATENT DOCUMENTS 5,710,503 A * 1/1998 Sideris et al. ................. 324/431
6,850,037 B2 * 2/2005 Bertness ....................... 320/132

FOREIGN PATENT DOCUMENTS

| JP | 60-020159 | 2/1985 |
|----|-----------|--------|
| JP | 05-101228 | 4/1993 |
| JP | 2003-92840 | 3/2003 |
| JP | 2007-233573 | 9/2007 |
| JP | 2007-300469 | 11/2007 |
| JP | 2010-060434 | 3/2010 |
| JP | 2010-206981 | 9/2010 |
| JP | 2010-249793 | 11/2010 |

* cited by examiner

*Primary Examiner* — Tung X Nguyen

(74) *Attorney, Agent, or Firm* — Nixon & Vanderhye PC

(57) ABSTRACT

A voltage detection device including a multiplexer provided with a plurality of input channels connected to respective battery cells and an output channel connected to an analog-to-digital (AD) converter. The multiplexer is further provided with an additional input channel that is connected to a voltage source that supplies a fault detection voltage. A multiplexer controller is triggered by an input trigger signal to instruct the multiplexer to sequentially connect the input channels and the additional input channel to the output channel according to a predetermined voltage detection sequence. An abnormality detector determines that there exists an abnormality in the multiplexer controller on the basis of an output of the AD converter when the AD converter detects the fault detection voltage at a timing different from a normal timing defined by the voltage detection sequence. This enables the voltage detection device to self-diagnose the multiplexer controller.

6 Claims, 4 Drawing Sheets

VOLTAGE DETECTION DEVICE AND SYSTEM

CROSS-REFERENCE TO RELATED APPLICATION

This application is based on and claims the benefit of priority from earlier Japanese Patent Application No. 2010-251940 filed Nov. 10, 2010, the description of which is incorporated herein by reference.

BACKGROUND

1. Technical Field

This invention relates to voltage detection device and system.

2. Related Art

A known battery control device, as disclosed in Japanese Patent Application Publication No. 2003-92840, includes fault diagnosis means for detecting a spontaneous change in threshold for overcharge and/or over-discharge detection of a battery cell. More specifically, the battery control device of Japanese Patent Application Publication No. 2003-92840 is configured to detect a cell voltage of the battery cell and compare the detected cell voltage with the threshold.

In the above device, the threshold is forcibly shifted from a normal value by a given amount when the cell voltage of the battery cell is compared with the threshold. That is, the threshold is incremented or decremented by the given amount. In case the forced change in threshold doesn't reverse a relation between the cell voltage of the battery cell and the threshold in terms of the magnitude of voltage, the battery control device determines that the spontaneous change in threshold is large. This allows a threshold characteristic deviation of a voltage detector in the device to be detected.

In the above device, however, since an analog-to-digital (AD) converter included in the voltage detector, which outputs a signal including one bit information indicative of whether or not the detected cell voltage of the battery cell is above the threshold, is considered to be of one-bit type, only characteristics of the voltage detector including the AD converter can be diagnosed.

In general, in an analog-to-digital (AD) conversion circuit of such a device as described above, a multiplexer switches between a plurality of battery cells to be connected to the AD converter. In such configuration, it may be assumed that there exists a switch selector that controls switching operation of the multiplexer.

Conventionally, even in the presence of a fault (or abnormality) in the switch selector, cell voltages of the battery cells remain unchanged. In other words, the fault in the switch selector doesn't affect the cell voltages of the battery cells. Therefore, it is unable to self-diagnose the switch selector on the basis of the detected cell voltages of the battery cells.

In consideration of the foregoing, exemplary embodiments of the present invention are directed to providing voltage detection device and system that are capable of self-diagnosing the switch selector for controlling switching operation of the multiplexer.

SUMMARY

In accordance with an exemplary aspect of the present invention, there is provided a voltage detection device including a multiplexer provided with a plurality of input channels and an output channel. Each of the plurality of input channels is connected to a corresponding one of a plurality of battery cells connected in series to form a battery pack, via anode and cathode of the corresponding battery cell.

The device further includes an analog-to-digital (AD) converter that AD converts an output of the multiplexer; a multiplexer controller that instructs the multiplexer to electrically connect one of the input channels to the output channel according to an input trigger signal; and an abnormality detector that determines whether or not there exists an abnormality in the multiplexer controller on the basis of an output of the AD converter.

The multiplexer is further provided with an additional input channel that is connected to a voltage source that supplies a fault detection voltage.

The multiplexer controller is triggered by the input trigger signal to instruct the multiplexer to sequentially connect the plurality of input channels and the additional input channel to the output channel according to a voltage detection sequence (or channel connection sequence) that defines an order in which the plurality of input channels and the additional input channel are sequentially connected to the output channel.

The abnormality detector determines that there exists an abnormality in the multiplexer controller when the AD converter detects the fault detection voltage at a timing different from a normal timing at which the AD converter is expected to normally detect the fault detection voltage according to the voltage detection sequence.

In this configuration, the multiplexer is provided with the additional channel in addition to the input channels connected to the respective battery cells, and the cell voltages of the battery cells and the fault detection voltage inputted to the additional channel are sequentially detected according to the voltage detection sequence. In cases where the AD converter detects the fault detection voltage inputted to the additional channel at a timing different from a normal timing, that is, at a timing other than when the AD converter is expected to normally detect the fault detection voltage according to the voltage detection sequence, the abnormality detector can determine that there exists an abnormality in the multiplexer controller. This enables the voltage detection device to self-diagnose the multiplexer controller.

DESCRIPTION OF SPECIFIC EMBODIMENTS

The present invention will be described more fully hereinafter with reference to the accompanying drawings. Like numbers refer to like elements throughout.

First Embodiment

Figure 1:
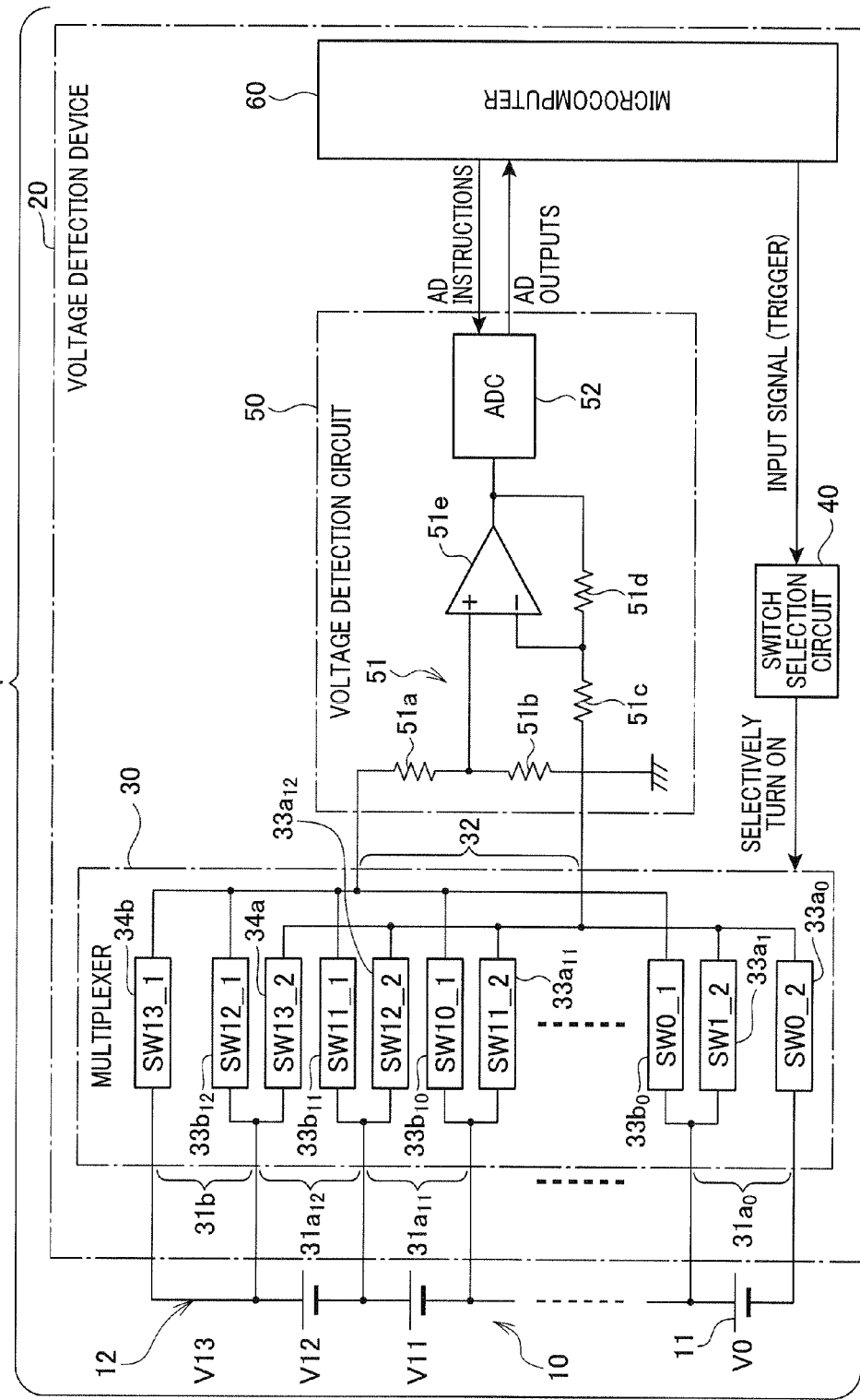
FIG. 1 is a schematic block diagram of a voltage detection system including a voltage detection device in accordance with a first embodiment of the present invention.

There will now be explained a first embodiment of the present invention with reference to FIGS. 1-3. FIG. 1 is a schematic diagram of a voltage detection system 1 including a voltage detection device 20 in accordance with the first embodiment of the present invention. As shown in FIG. 1, the voltage detection system 1 includes a battery pack 10 and the voltage detection device 20.

The battery pack 10 is a set of battery cells 11 connected in series. For example, in the present embodiment, thirteen battery cells 11 (whose cell voltages are respectively designated as V0-V12 from the bottom to the top of FIG. 1) are connected in series. Each battery cell 11 may be a rechargeable, lithium ion secondary battery. The voltage detection device 20 may be used for an electrical or hybrid car or the like. The battery pack 10 may be mounted in the electrical or hybrid car, and may be used in a power supply for driving an electrical load, such as an inverter and a motor, or in a power supply for an electronic device.

The voltage detection device 20, which monitors a cell voltage for each battery cell 11 of the battery pack 10, includes a multiplexer 30, a switch selection circuit 40, a voltage detection circuit 50, and a microcomputer 60.

The multiplexer 30 includes a set of switches that connect one of battery cells 11 of the battery pack 10 to the voltage detection circuit 50. The multiplexer 30 is provided with a plurality of input channels $31a_0$-$31a_{12}$ through each of which both electrodes (anode and cathode) of corresponding battery cell 11 are connected to the multiplexer, and an output channel 32 through which the multiplexer is connected to the voltage detection circuit 50. In the present embodiment, the multiplexer 30 is integrated into an integrated circuit (IC), where the input channels $31a_0$-$31a_{12}$ and the output channel 32 are IC package terminals.

In addition, the multiplexer 30 includes a plurality of switches for selectively connecting one of the input channels $31a_0$-$31a_{12}$ to the output channel 32. The plurality of switches include a plurality of anode-side switches $33a_0$-$33a_{12}$ (SW0_2-SW12_2), each of which is connected to an anode of a corresponding battery cell 11, and a plurality of cathode-side switches $33b_0$-$33b_{12}$ (SW0_1-SW12_1), each of which is connected to a cathode of a corresponding battery cell 11.

For example, to detect a cell voltage V11 of the battery cell 11, an anode-side switch $33a_{11}$ (SW11_2) and a cathode-side switch $33b_{11}$ (SW11_1) are both turned on.

The multiplexer 30 further includes another channel 31b in addition to the input channels $31a_0$-$31a_{12}$ being connected to the respective battery cells 11. In the present embodiment, the additional channel 31b is also connected to the battery pack 10, and is connected not to any battery cell 11, but to a wiring 12 which is included in the battery pack 10. The additional channel 31b of the multiplexer 30 is thus configured to receive a fault detection voltage of 0V.

The cell voltage of each battery cell 11 is normally within a normal voltage range, for example, of 4-6 V. The fault detection voltage is set outside such a normal voltage range.

To connect the additional channel 31b to the output channel 32, the multiplexer 30 further includes additional switches that are distinct from the above switches for connecting the input channels $31a_0$-$31a_{12}$ to the output channel 32. The additional switches include an anode-side switch 34a (SW13_2) and a cathode-side switch 34b (SW13_1). With this configuration, when the switches 34a, 34b are both turned on (while the other switches are in an off-state), the anode-side switch 34a (SW13_2) and the cathode-side switch 34b (SW13_1) will be short-circuited through the wiring 12, and then the fault detection voltage of 0 V will be outputted from the output channel 32.

The switches $33a_0$-$33a_{12}$, $33b_0$-$33b_{12}$, and the additional switches 34a, 34b may be composed of transistors.

The switch selection circuit 40 on/off-controls the switches $33a_0$-$33a_{12}$, $33b_0$-$33b_{12}$ and the additional switches 34a, 34b of the multiplexer 30. The switch selection circuit 40 may include a counter, a decoder or the like.

The switch selection circuit 40 instructs the switches $33a_0$-$33a_{12}$, $33b_0$-$33b_{12}$ and the additional switches 34a, 34b of the multiplexer 30 to connect the input channels $31a_0$-$31a_{12}$ and the additional channel 31b to the output channel 32 one after another according to a predetermined voltage detection sequence. In the present embodiment, the voltage detection sequence is defined such that the cell voltages from V0 to V12 and then the fault detection voltage V12 are sequentially detected (in a direction from the bottom to the top in FIG. 1).

A trigger signal of a fixed frequency from the microcomputer 60 triggers the switch selection circuit 40 to perform the voltage detection sequence. The switch selection circuit 40 is integrated into the integrated circuit.

The voltage detection circuit 50 amplifies and measures a cell voltage of the battery cell 11, among the plurality of battery cells, selected thorough the multiplexer 30. For this purpose, the voltage detection circuit 50 includes a differential amplifier circuit 51 and an AD converter 52 ("ADC" in FIG. 1).

The differential amplifier circuit 51 includes resistors 51a-51d and an operational amplifier 51e, and is connected to the output channel 32 of the multiplexer 30. The resistor 51a is connected to the output channel 32 of the multiplexer 30 on the cathode side. The resistor 51b is connected between the resistor 51a and ground. A connection point between the resistor 51a and the resistor 51b is connected to a non-inverting input terminal of the operational amplifier 51e. The resistor 51c is connected to the output channel 32 of the multiplexer 30 on the anode side. The resistor 51d is connected between the resistor 51c and an output terminal of the operational amplifier 51e. A connection point between the resistor 51c and the resistor 51d is connected to an inverting input terminal of the operational amplifier 51e. The output terminal of the operational amplifier 51e is connected to the AD converter 52.

The AD converter 52 measures the amplified cell voltage of the battery cell 11 outputted from the operational amplifier 51e in response to an AD instruction from the microcomputer 60. The AD converter 52 then converts the measured cell voltage into a digital signal, and outputs the digital signal (as an AD output) to the microcomputer 60. The voltage detection circuit 50 is integrated into the integrated circuit.

The microcomputer 60 includes a CPU (not shown), a ROM (not shown), an EEPROM (not shown), a RAM (not shown) and others, and monitors a state of each battery cell 11 by running programs stored in the ROM or the like. More specifically, the microcomputer 60 estimates a state of charge (SOC) of the battery pack 10 on the basis of the measured cell voltage of each battery cell 11 outputted from the AD converter 52 and an electrical current following through the battery pack 10 measured by a measurement circuit (not shown), and then controls charging and discharging of each battery cell 11 on the basis of the SOC through an equalization discharge circuit (not shown) or the like.

The microcomputer 60 also determines whether or not there exists an abnormality in the switch selection circuit 40 on the basis of the output of the AD converter 52. More specifically, the microcomputer 60 outputs a trigger signal to the switch selection circuit 40 to instruct the switch selection circuit 40 to perform the voltage detection sequence. The microcomputer 60 further monitors a timing at which the AD converter 52 actually detects the fault detection voltage (hereinafter referred to as an actual timing). In cases where the actual timing doesn't coincide with a timing defined by the voltage detection sequence (hereinafter referred to as a normal timing), the microcomputer 60 determines that there exists an abnormality occurring in the switch selection circuit 40. This enables the microcomputer 60 to detect a fault in the switch selection circuit 40.

There will now be explained an operation of the voltage detection device 20 in accordance with the present embodiment with reference to FIG. 2 and FIG. 3.

There will now be explained a normal operation of the switch selection circuit 40. FIG. 2 is a timing diagram for the voltage detection device 20 when the switch selection circuit 40 is in a normal state.

Figure 2:
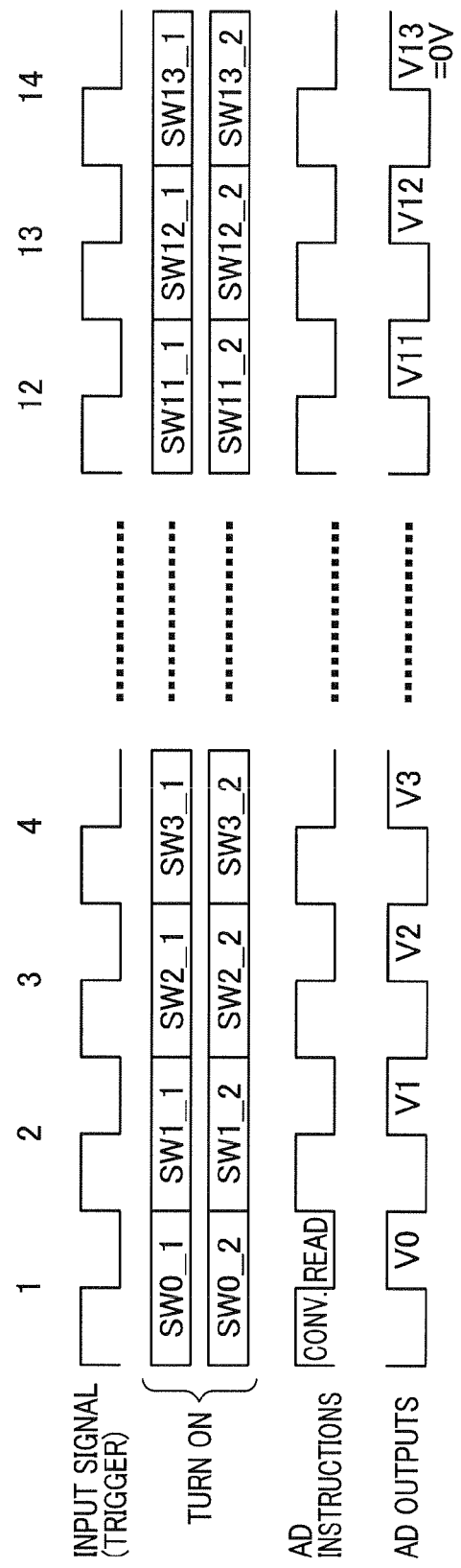
FIG. 2 is a timing diagram for the voltage detection device when a switch selection circuit is in a normal state.

As shown in FIG. 2, the trigger signal is inputted from the microcomputer 60 to the switch selection circuit 40 to trigger the switch selection circuit 40 to perform the voltage detection sequence. This enables the input channels $31a_0$-$31a_{12}$ to be sequentially connected to the output channel 32 according to the voltage detection sequence at timings when the consecutive rising edges (or pulses) of the trigger signal appear.

More specifically, once the first ($1^{st}$) pulse of the trigger signal is inputted to the switch selection circuit 40, the anode-side switch $33a_0$ (SW0_2) and the cathode-side switch $33b_0$ (SW0_1) are both turned on. This leads to electrical connection of the input channel $31a_0$ associated with the battery cell 11 whose cell voltage is designated as V0 to the output channel 32, thereby connecting the battery cell 11 whose cell voltage is designated as V0 to the voltage detection circuit 50.

During the trigger signal being at a high level, a first AD instruction is outputted from the microcomputer 60 to the AD converter 52 for AD converting the cell voltage V0 of the battery cell 11 (whose cell voltage is V0). Upon reception of the first AD instruction, the AD converter 52 AD converts the cell voltage V0 of the battery cell 11 inputted from the multiplexer 30 through the differential amplifier circuit 51.

Subsequently, once the trigger signal changes to a low level, a second AD instruction is outputted from the microcomputer 60 to the AD converter 52 for outputting the AD converted cell voltage V0 of the battery cell 11. Upon reception of the second AD instruction, the AD converter 52 outputs the cell voltage V0 of the battery cell 11 to the microcomputer 60. The microcomputer 60 can thus read the cell voltage V0 of battery cell 11.

In this way, as described above, the microcomputer 60 acquires the cell voltage V0 of the battery cell 11. In a similar manner to the above, the microcomputer 60 can sequentially acquire the cell voltages V1-V12 of the remaining battery cells 11 one after another according to the voltage detection sequence.

Once the fourteenth ($14^{th}$) pulse of the trigger signal is inputted to the switch selection circuit 40 after detection of the cell voltage V12 of the battery cell 11, the anode-side switch 34*a* (SW13_2) and the cathode-side switch 34*b* (SW13_1) of the multiplexer 30 are both turned on. This leads to electrical connection of the additional channel 31*b* corresponding to V13 to the output channel 32, thereby connecting the wiring 12 to the voltage detection circuit 50.

During the fourteenth ($14^{th}$) pulse of the trigger signal, the fault detection voltage (=0V) inputted to the additional channel 31*b* is AD converted in response to the first AD instruction from the microcomputer 60 for AD converting the fault detection voltage ("CONV" in FIG. 2). Subsequently, once the trigger signal changes to a low level, the AD converter 52 outputs the fault detection voltage (=0V) to the microcomputer 60 after the AD conversion in response to the second AD instruction from the microcomputer 60 for outputting the fault detection voltage ("READ" in FIG. 2). In this way, the fault detection voltage (=0V) designated as V13 can be detected.

In the microcomputer 60, it is determined whether or not the fault detection voltage inputted to the additional channel 31*b* is detected at the normal timing according to the voltage detection sequence. That is, in the present embodiment, the fault detection voltage V13 is normally detected after detection of all the cell voltages V0-V12 of the battery cells 11. Therefore, the on/off-control of the switch selection circuit 40 triggered by the fourteenth pulse of the trigger signal outputted from the microcomputer 60 allows the microcomputer 60 to determine whether or not the fourteenth acquired voltage coincides with the fault detection voltage V13.

The microcomputer 60 determines whether or not the fourteenth ($14^{th}$) acquired voltage is equal to or smaller than a threshold, which enables the microcomputer 60 to determine whether or not the fourteenth ($14^{th}$) acquired voltage is the fault detection voltage V13.

In normal operation, as shown in FIG. 2, the fourteenth ($14^{th}$) pulse of the trigger signal triggers the additional switches 34*a*, 34*b* to be both turned on. Since the fourteenth ($14^{th}$) voltage read by the microcomputer 60 is the fault detection voltage V13, it can be determined by the microcomputer 60 that the switch selection circuit 40 is operating normally.

For example, the microcomputer 60 may perform the above sequential voltage detection according the voltage detection sequence cyclically. Accordingly, as long as the microcomputer 60 detects the fault detection voltage V13 periodically in time, it can be assumed that the switch selection circuit 40 is operating normally. That is, the switches $33a_0$-$33a_{12}$, $33b_0$-$33b_{12}$ and the additional switches 34*a*, 34*b* of the multiplexer 30 are on/off-controlled by the switch selection circuit 40 according to the voltage detection sequence.

There will now be explained an abnormal operation of the switch selection circuit 40 of the present embodiment. FIG. 3 is a timing diagram for the voltage detection device 20 when the switch selection circuit 40 is in an abnormal state.

In abnormal operation, it can be supposed, for example, that the switch selection circuit 40 skips the switches $33a_2$, $33b_2$, $33a_3$, $33b_3$ (not shown) connected to the respective battery cells 11 whose cell voltages are designated as V2 and V3.

Figure 3:
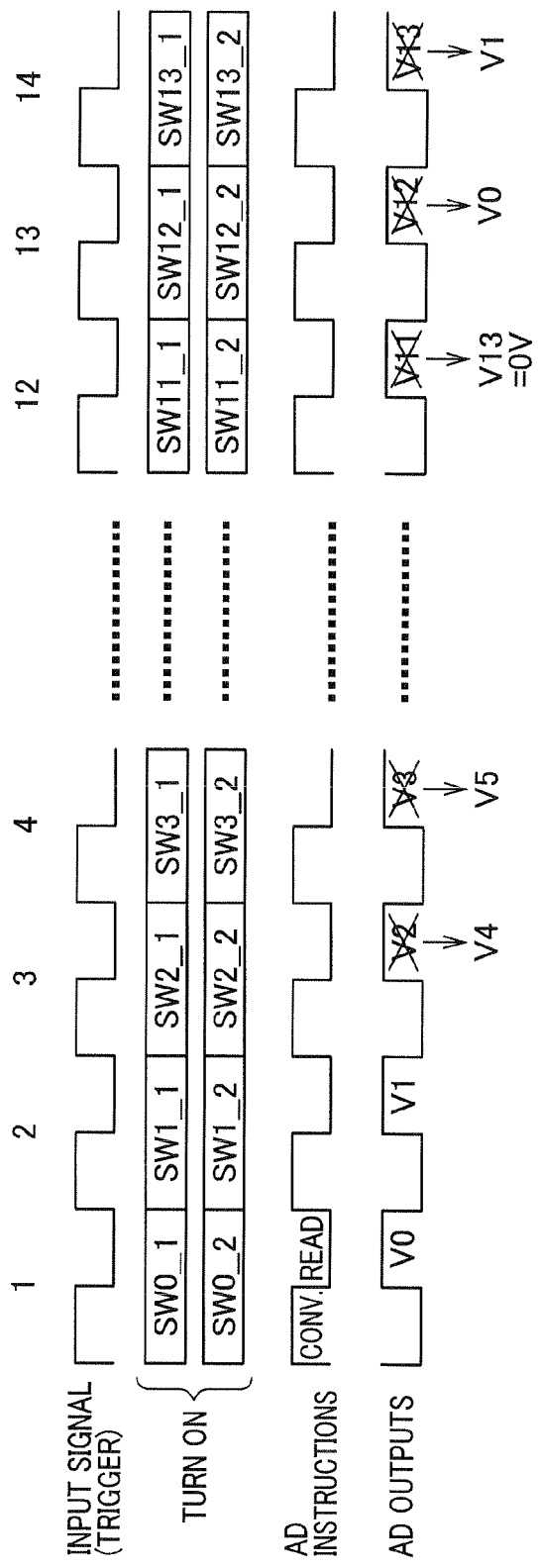
FIG. 3 is a timing diagram for the voltage detection device when a switch selection circuit is in an abnormal state.

In such a case, as shown in FIG. 3, the cell voltage V0 of the battery cell 11 is detected by the microcomputer 60 at a timing at which the first pulse of the trigger signal appears, and then the cell voltage V1 of the battery cell 11 is detected by the microcomputer 60 at a timing at which the second pulse of the trigger signal appears, in a similar manner as described above.

Subsequently, in the abnormal operation where the detection of cell voltages V2, V3 of the battery cells 11 is skipped due to some abnormality occurring in the switch selection circuit 40, the switches $33a_4$, $33b_4$ (not shown) connected to battery cell 11 whose cell voltage is designated as V4 are both turned on. Accordingly, the microcomputer 60 acquires the cell voltage V4 of the battery cell 11 at a timing at which the third pulse of the trigger signal appears.

Without the abnormality occurring in the switch selection circuit 40, the switches $33a_2$, $33b_2$ connected to the battery cell 11 whose cell voltage is designated as V2 could be both turned on at the timing at which the third pulse of the trigger signal is inputted to the switch selection circuit 40.

In this way, due to the abnormality occurring in the switch selection circuit 40, there has been detected not the cell voltage V2 of the battery cell 11 that can be expected to be detected in normal operation at the timing at which the third pulse of the trigger signal inputted from the microcomputer 60 to the switch selection circuit 40 appears, but the cell voltage V4 of the battery cell 11. In other words, all the cell voltages of the battery cells 11 of V0-V4 have not been detected according to the voltage detection sequence.

Subsequently, the cell voltage V5 of the battery cell 11 is detected at a timing at which the fourth pulse of the trigger signal appears. In a similar way, subsequent cell voltages V6-V12 of the battery cells 11 are detected one after another according to the voltage detection sequence. As described above, since the detection of the cell voltages V2, V3 of the battery cells 11 was skipped, the cell voltage V12 of the battery cell 11 is detected at a timing at which the eleventh ($11^{th}$) pulse of the trigger signal is inputted to the switch selection circuit 40.

At the end of the voltage detection sequence, the fault detection voltage (=0V) designated as V13 is detected at a timing at which the twelfth ($12^{th}$) pulse of the trigger signal is inputted to the switch selection circuit 40. In the next cycle, the cell voltage V0 of the battery cell 11 is detected again at a timing at which the thirteenth ($13^{th}$) pulse of the trigger signal is inputted to the switch selection circuit 40, and then the cell voltage V1 of the battery cell 11 is detected at a timing at which the fourteenth ($14^{th}$) pulse of the trigger signal is inputted to the switch selection circuit 40.

The microcomputer 60 can determine whether or not the fault detection voltage inputted to the additional channel 31$b$ has been normally detected at a timing defined by the voltage detection sequence. This enables the microcomputer 60 to determine that the timing at which the AD converter 52 actually detects the fault detection voltage doesn't coincide with the timing at which the AD converter 52 is expected to detect the fault detection voltage according to the voltage detection sequence. In other words, as shown in FIG. 3, since the fourteenth ($14^{th}$) voltage acquired by the microcomputer 60 at the timing at which the fourteenth ($14^{th}$) pulse of the trigger signal appears is the cell voltage V1 of the battery cell 11, it is determined by the microcomputer 60 that the switch selection circuit 40 is in an abnormal state or malfunctioning.

In this way, in cases where the microcomputer 60 is unable to detect the fault detection voltage at its normal timing, i.e., a timing at which the microcomputer 60 is expected to normally detect the fault detection voltage according to the voltage detection sequence, the microcomputer 60 is allowed to determine that there exists an abnormality (or a fault) in the switch selection circuit 40. Since the abnormality has occurred in the switch selection circuit 40 immediately after the detection of the cell voltage V1 of the battery cell 11, the cell voltage value V1 itself of the battery cell 11 cannot be considered reliable.

As described above, in the present embodiment, the multiplexer 30 is provided with the additional channel 31$b$ in addition to the input channels 31$a_0$-31$a_{12}$ connected to the respective battery cells 11, and the cell voltages of the battery cells 11 and the fault detection voltage inputted to the additional channel 31$b$ can be sequentially detected according to the voltage detection sequence. With this configuration, the microcomputer 60 determines whether or not the fault detection voltage inputted to the additional channel 31$b$ has been detected at a normal timing, that is, a timing at which the AD converter 52 is expected to normally detect the fault detection voltage according to the voltage detection sequence, which enables the microcomputer 60 to determine that there exists an abnormality in the switch selection circuit 40. In other words, in cases where the AD converter 52 has detected the fault detection voltage inputted to the additional channel 31$b$ at a timing different from (or other than) the normal timing, the microcomputer 60 can determine that there exists an abnormality in the switch selection circuit 40. This enables the voltage detection device 20 to self-diagnose the switch selection circuit 40 thereof that selectively switches between the switches 33$a_0$-33$a_{12}$, 33$b_0$-33$b_{12}$ and the additional switches 34$a$, 34$b$ in response to the pulses (or rising edges) of the trigger signal from the microcomputer 60.

In the present embodiment, the fault detection voltage is set to a voltage (=0V) that the cell voltages of the battery cells 11 are not likely to take, which enables the microcomputer 60 to reliably discriminate between the cell voltages of the battery cells 11 and the fault detection voltage.

Second Embodiment

There will now be explained a second embodiment of the present invention with reference to FIG. 4. For brevity, only differences from the first embodiment will be explained below. In the second embodiment the fault detection voltage is provided within the multiplexer 30, while in the first embodiment the fault detection voltage is provided to the wiring 12 outside the multiplexer 30.

Figure 4:
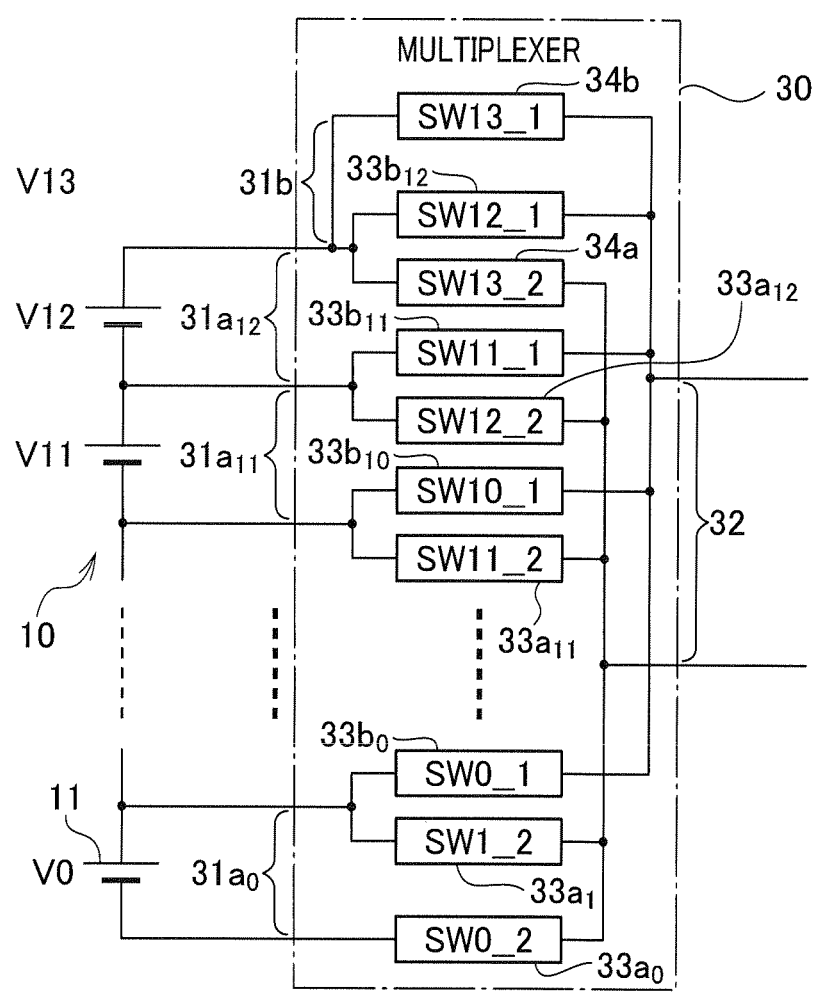
FIG. 4 is a partial block diagram of a voltage detection system including a voltage detection device in accordance with a second embodiment of the present invention.

FIG. 4 shows a partial block diagram of the voltage detection system including the voltage detection device in accordance with the second embodiment of the present invention. In FIG. 4, only the battery pack 10, the voltage detection device 20 and the multiplexer 30 are shown, and the other components, which are same as those in the first embodiment, are omitted for simplicity.

As described above, the multiplexer 30 is integrated in an integrated circuit (IC). As shown in FIG. 4, the additional channel 31$b$ associated with the fault detection voltage V13 (=0V) is also included in the integrated circuit. More specifically, a cathode-side switch 34$b$ (SW13_1) is electrically connected to an anode-side switch 34$a$ (SW13_2) within the integrated circuit.

With this configuration, since the number of pins of the multiplexer 30 is only required to be a linear function of the number of the battery cells 11 of the battery pack 10, the number of pins of the multiplexer 30 may be reduced. The wiring 12 for applying the fault detection voltage to the battery pack 10 is absent.

In the second embodiment as described above, the multiplexer 30 being integrated into the integrated circuit (IC) allows the additional channel 31$b$ to be provided in the multiplexer 30.

Other Embodiment

It is to be understood that the invention is not to be limited to the specific embodiments disclosed above. In some alternative embodiments without the differential amplifier circuit 51, the output channel 32 may be directly connected to the AD converter 52. In some other embodiments where a plurality of battery packs 10 are provided, there may be provided for each battery pack 10 an integrated circuit (IC) in which the multiplexer 30, the voltage detection circuit 50 and the switch selection circuit 40 are integrated, where one microcomputer 60 may control and manage the plurality of integrated circuits (ICs). In further embodiments, only the multiplexer 30 may be fabricated as the integrated circuit (IC).

In the first and second embodiments described above, the voltage detection sequence was defined such that the cell voltages of the battery cells 11 and the fault detection voltage are sequentially detected from V0 to V13. In some other embodiments, other voltage detection sequences are allowed.

In the first and second embodiments described above, the fault detection voltage was set to 0V. In some other embodiments, the fault detection voltage may be set to a non-zero value. For example, the fault detection voltage may be set to a voltage of higher than 10V that the cell voltage of each battery cell 11 is not likely to take, where a voltage source for supplying the fault detection voltage of higher than 10V may be provided within the battery pack 10 or the multiplexer 30, and the anode-side and cathode-side switches may be connected to negative and positive terminals of the voltage source, respectively. The fault detection voltage may be such that it is possible to reliably discriminate between the fault detection voltage and the cell voltage of each battery cell 11 within the normal voltage range.

Further, in the first and second embodiments described above, the multiplexer 30 was provided with one additional channel 31b, and the fault detection voltage inputted to the additional channel 31b was detected according to the voltage detection sequence. In some other embodiments, the multiplexer 30 may be provided with a plurality of additional channels 31b, each as described above. For example, in some embodiments where the multiplexer 30 is provided with two additional channels 31b to each of which a prescribed fault detection voltage (=0V) is inputted as described regarding the first or second embodiment. The fault detection voltage (=0V) is preferable to be detected non-periodically in time. More specifically, the fault detection voltage inputted to a first additional channel 31b may be detected after sequential detection of cell voltages of the first five battery cells 11, and then the fault detection voltage inputted to a second additional channel 31b may be detected after sequential detection of cell voltages of more or less than five battery cells 11 subsequent to the first five battery cells. It is preferable that the fault detection voltage inputted to the additional channels 31b is detected non-periodically in time. Such non-periodic detection of the fault detection voltage makes it possible to reliably detect a fault in the switch selection circuit 40. Use of the plurality of additional channels 31b also makes it possible to quickly detect that the fault detection voltage has been detected non-periodically in time. In some other embodiments, the plurality of additional channels 31b may be supplied with mutually different fault detection voltages.

Still further, in the first and second embodiments described above, the voltage detection device 20 and the voltage detection system were for use with the hybrid or electrical car. The present invention is not limited to such application. There are allowed other applications where devices are powered by the battery pack 10.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A voltage detection device comprising:
   a multiplexer provided with a plurality of input channels and an output channel, each of the plurality of input channels being connected to a corresponding one of a plurality of battery cells connected in series to form a battery pack, via anode and cathode of the corresponding battery cell;
   an analog-to-digital (AD) converter that AD converts an output of the multiplexer;
   a multiplexer controller that instructs the multiplexer to electrically connect one of the input channels to the output channel according to an input trigger signal; and
   an abnormality detector that determines whether or not there exists an abnormality in the multiplexer controller on the basis of an output of the AD converter,
   wherein the multiplexer is further provided with an additional input channel that is connected to a voltage source that supplies a fault detection voltage,
   the multiplexer controller is triggered by the trigger signal to instruct the multiplexer to sequentially connect the plurality of input channels and the additional input channel to the output channel according to a voltage detection sequence that defines an order in which the plurality of input channels and the additional input channel are sequentially connected to the output channel, and
   the abnormality detector determines that there exists an abnormality in the multiplexer controller in cases where the AD converter detects the fault detection voltage at a timing different from a normal timing at which the AD converter is expected to normally detect the fault detection voltage according to the voltage detection sequence,
   wherein the multiplexer comprises a plurality of switches each connected to a corresponding one of the input channels, and an additional switch connected to the additional input channel, and
   the multiplexer controller is triggered by the trigger signal to on/off-control the plurality of switches and additional switch of the multiplexer so that the plurality of input channels and the additional input channel are sequentially connected to the output channel according to the voltage detection sequence.

2. The device of claim 1, wherein the fault detection voltage is set to a voltage value outside a normal voltage range for the cell voltages of the battery cells.

3. The device of claim 1, wherein the multiplexer is fabricated as an integrated circuit (IC), and the additional channel is provided in the integrated circuit.

4. A voltage detection system comprising:
   a battery pack including a plurality of battery cells connected in series;
   a multiplexer provided with a plurality of input channels and an output channel, each of the plurality of input channels being connected to a corresponding one of the plurality of battery cells via anode and cathode of the corresponding battery cell;
   an analog-to-digital (AD) converter that AD converts an output of the multiplexer;
   a multiplexer controller that instructs the multiplexer to electrically connect one of the input channels to the output channel according to an input trigger signal; and
   an abnormality detector that determines whether or not there exists an abnormality in the multiplexer controller on the basis of an output of the AD converter,
   wherein the multiplexer is further provided with an additional input channel that is connected to a voltage source that supplies a fault detection voltage,
   the multiplexer controller is triggered by the trigger signal to instruct the multiplexer to sequentially connect the plurality of input channels and the additional input channel to the output channel according to a voltage detection sequence that defines an order in which the plurality of input channels and the additional input channel are sequentially connected to the output channel, and the abnormality detector determines that there exists an abnormality in the multiplexer controller in cases where the AD converter detects the fault detection voltage at a timing different from a normal timing at which the AD converter is expected to normally detect the fault detection voltage according to the voltage detection sequence, wherein the multiplexer comprises a plurality of switches each connected to a corresponding one of the input channels, and an additional switch connected to the additional input channel, and the multiplexer controller is triggered by the trigger signal to on/off-control the plurality of switches and additional switch of the multiplexer so that the plurality of input channels and the additional input channel are sequentially connected to the output channel according to the voltage detection sequence.

5. The system of claim 4, wherein the fault detection voltage is set to a voltage value outside a normal voltage range for the cell voltages of the battery cells.

6. The system of claim 4, wherein the multiplexer is fabricated as an integrated circuit (IC), and the additional channel is provided in the integrated circuit.

\* \* \* \* \*